United States Patent
Katiyar et al.

(10) Patent No.: US 7,081,371 B1
(45) Date of Patent: Jul. 25, 2006

(54) FABRICATION OF STABLE, WIDE-BANDGAP THIN FILMS OF MG, ZN AND O

(75) Inventors: Ram S. Katiyar, San Juan, PR (US); Pijush Bhattacharya, San Juan, PR (US); Rasmi R. Das, San Juan, PR (US)

(73) Assignee: University of Puerto Rico, San Juan, PR (US)

(*) Notice: Subject to any disclaimer, the term of this patent is extended or adjusted under 35 U.S.C. 154(b) by 195 days.

(21) Appl. No.: 10/932,656

(22) Filed: Sep. 2, 2004

(51) Int. Cl.
*H01L 21/36* (2006.01)

(52) U.S. Cl. ........................... 438/104; 438/479
(58) Field of Classification Search ............ 438/85, 438/104
See application file for complete search history.

(56) References Cited

U.S. PATENT DOCUMENTS

| | | | |
|---|---|---|---|
| 6,617,183 B1* | 9/2003 | Kadota et al. | 438/22 |
| 2002/0084466 A1* | 7/2002 | Narayan et al. | 257/96 |
| 2003/0129307 A1* | 7/2003 | Lu et al. | 427/255.28 |
| 2003/0160176 A1* | 8/2003 | Vispute et al. | 250/372 |
| 2005/0020035 A1* | 1/2005 | Nause et al. | 438/478 |
| 2006/0054888 A1* | 3/2006 | Ito et al. | 257/43 |

FOREIGN PATENT DOCUMENTS

| | | | |
|---|---|---|---|
| EP | 863555 A2 * | 9/1998 | |

OTHER PUBLICATIONS

S. Choopun, R. D. Vispute, W. Yang, R. P. Sharma, T. Venkatesan and H. Shen; Realization of band gap above 5.0 eV in metastable cubic-phase $Mg_xXN_{1-x}O$ alloy films; *Applied Physics Letters*, vol. 80, No. 9; 2002; pp. 1529-1531; USA.

T. Makino, N. T. Tuan, H. D. Sun, C. H. Chia, Y. Segawa, M. Kawasaki, A. Ohtomo, K. Tamura, T. Suemoto, H. Akiyama, M. Baba, S. Saito, T. Tomita and H. Koinuma; Temperature dependence of near ultraviolet photoluminescence in ZnO/(Mg,Zn)O multiple quantum wells; *Applied Physics Letters*, vol. 78, No. 14; 2001; pp. 1979-1981; Japan.

(Continued)

*Primary Examiner*—Stephen W. Smoot
(74) *Attorney, Agent, or Firm*—Hoglund & Pamias, PSC; Heath W. Hoglund

(57) ABSTRACT

A stable, wide-bandgap (approximately 6 eV) ZnO/MgO multilayer thin film is fabricated using pulsed-laser deposition on c-plane $Al_2O_3$ substrates. Layers of ZnO alternate with layers of MgO. The thickness of MgO is a constant of approximately 1 nm; the thicknesses of ZnO layers vary from approximately 0.75 to 2.5 nm. Abrupt structural transitions from hexagonal to cubic phase follow a decrease in the thickness of ZnO sublayers within this range. The band gap of the thin films is also influenced by the crystalline structure of multilayer stacks. Thin films with hexagonal and cubic structure have band-gap values of 3.5 and 6 eV, respectively. In the hexagonal phase, Mg content of the films is approximately 40%; in the cubic phase Mg content is approximately 60%. The thin films are stable and their structural and optical properties are unaffected by annealing at 750° C.

18 Claims, 5 Drawing Sheets

OTHER PUBLICATIONS

T. Makino, C. H. Chia, Nguen T. Tuan, H. D. Sun, Y. Segawa, M. Kawasaki, A. Ohtomo, K. Tamura and H. Koinuma; Room Temperature luminescence of excitons in ZnO/(Mg,Zn)O multiple quantum wells on lattice-matched substrates; *Applied Physics Letters*, vol. 77, No. 7; 2000; pp. 975-977; Japan.

Y. Chen, R. Schneider, S. Y. Wang, R. S. Kern, C. H. Chen and C. P. Kuo; Dislocation reduction in GaN thin films via lateral overgrowth from trenches; *Applied Physics Letters*, vol. 73, No. 14; 1999; pp. 2062-2063; USA.

Toshio Kawahara, Hiroko Uchino, Hiroshi Inai, Kazuhiko Kato, Yoichi Okamoto, Jun Morimoto and Toru Miyakawa; Thermoelectric Properties of and Dopant Distribution in SiC Thin Films; *Japanese Journal of Applied Physics*; vol. 38; 1999; pp. 4852-4856; Japan.

A. K. Sharma, J. Narayan, J. F. Muth, C. W. Teng, C. Jin, A. Kvit, R. M. Kolbas, and O. W. Holland; Optical and structural properties of epitaxial $Mg_xZn_{1-x}O$ alloys; *Applied Physics Letters*; vol. 75, No. 21; 1999; pp. 3327-3329; USA.

A. Ohtomo, M. Kawasaki, T. Koida, K. Masubuchi, H. Koinuma, Y. Sakurai, Y. Yoshida, T. Yasuda and Y. Segawa; $Mg_xZn_{1-x}O$ as a II-VI widegap semiconductor alloy; *Applied Physics Letters*, vol. 72, No. 19; 1998; pp. 2466-2468; Japan.

C. Boney, Z. Yu, W. H. Rowland, Jr., W. C. Hughes, J. W. Cook, Jr., J. F. Schetzina, Gene Cantwell and William C. Harsch; II-VI blue/green laser diodes on ZnSe substrates; *J. Vac. Sci. Technol. B 14*(3); 1996; pp. 2259-2262; USA.

R. D. Shannon; Revised Effective Ionic Radii and Systematic Studies of Interatomic Distances in Halides and Chalcogenides; *Acta Cryst.*, 1976, pp. 751-767; USA.

\* cited by examiner

FABRICATION OF STABLE, WIDE-BANDGAP THIN FILMS OF MG, ZN AND O

GOVERNMENT SPONSORED RESEARCH

The subject invention was supported, in part, by a grant from the Department of Energy through grant nos. DE-F6-02—01ER45868 and NCC3-1034.

FIELD OF THE INVENTION

The invention relates generally to a method of fabricating a wide-bandgap thin film, and more specifically to a method of layering MgO and ZnO in a stable structure.

BACKGROUND OF THE INVENTION

ZnO thin films have a direct band gap of 3.23 eV. D. M. Bagnall, et al., Appl. Phys. Lett. 70, 2230 (1997), suggest the use of ZnO thin films in a variety of applications, including optoelectronic devices in the ultraviolet region. ZnO thin films have a high excitonic energy (approximately 60 meV). Moreover, ZnO in solid solution with MgO can produce higher band-gap, $Mg_xZn_{1-x}O$ (hereinafter "MZO") alloys.

A. Ohtomo, et al., Appl. Phys. Lett. 77, 975 (2000), suggest the use of MZO alloys for quantum well structures.

T. Mukano, et al., Appl. Phys. Lett. 78, 1979 (2000) reports the quantum well structure of ZnO/MgZnO muiltilayers, explaining the radiative recombination of electron-hole pairs in terms of quantum-confined Stark and Franz-Keldish effects. According to the phase diagram of ZnO—MgO binary systems as explained by E. R. Segnit, et al., J. Am. Ceram. Soc. 48, 412 (1965), the thermodynamic solid solubility of MgO in a ZnO matrix is less than 4 mol %.

The crystal structures of ZnO (which is wurtzite hexagonal, with a=53.24 Å and c=55.20 Å) and MgO (which is cubic, with a=54.24 Å) are entirely different. However, the ionic radii of $Mg^{2+}$ (which is 0.57 Å) and $Zn^{2+}$ (which is 0.60 Å) are quite close and may alloy by replacing each other in an MZO matrix. Similarly, the ionic radii of MgO (which is 0.136 nm) and ZnO (which is 0.125) are quite close.

A. Ohtomo, et al., Appl. Phys. Lett. 77, 975 (2000) teach that alloying ZnO with different concentrations of MgO can enhance its band gap. Generally, with higher Mg concentrations, the MZO alloys form a metastable material. The metastable phase and degree of metastability are the limiting factors for practical applications of MZO based devices.

A. Ohotomo, et al., Appl. Phys. Lett. 72, 2466 (1998) teach the formation of highly c-axis oriented, metastable, hexagonal MZO thin films with 30% Mg contents. These MZO thin films were grown by the pulsed laser deposition (PLD) technique on single crystal (0001) $Al_2O_3$. According to them, MZO films with a Mg concentration above 33% were segregated to hexagonal and cubic phase.

J. Naryana, et al., Solid State Commun. 121, 9 (2002), teach the growth of epitaxial cubic MZO thin films with a composition of $Mg_{0.8}Zn_{0.2}O$ on Si substrates. These MZO thin films did not have segregation of any secondary phase.

S. Choopun, et al., Appl. Phys. Lett. 80, 1529 (2002) teach the fabrication of a wide-band-gap (approximately 6 eV), metastable MZO alloy. This was obtained with 50% Mg insertion at Zn sites using the PLD technique. Their results showed a wide variation of Mg concentrations (approximately 50%–85%) with the variation in substrate temperature. However, the main drawback of their results was the phase separation of MgO (which is cubic) from ZnO (which is hexagonal) after rapid thermal annealing for 1 min at 750° C. This phase separation reduced the band gap to 3 eV.

Further background is provided in:
(a) Y. R. Ryu, et al., J. Cryst. Growth 219, 419 (2000);
(b) T. Aoki, et al., Appl. Phys. Lett. 76, 3257 (2000);
(c) A. K. Sharma, et al., Appl. Phys. Lett. 75, 3327 (1999);
(d) T. Makino, et al., Appl. Phys. Lett. 81, 2355 (2002);
(e) R. D. Shannon, et al., Sect. A: Cryst. Phys., Diffr., Theor. Gen. Crystallogr. 32, 751 (1976); and
(f) J. Sigman, D. P. Norton, H. M. Christen, P. H. Fleming, and L. A. Boatner, Phys. Rev. Lett. 88, 097601 (2002).

Each of the above publications, along with each of the publications previously mentioned, is expressly incorporated herein by reference in their entirety.

In view of the forgoing, a method is desired to fabricate a stable, wide-band-gap MZO alloy. The MZO alloy must not exhibit a significant change in structural and optical properties even after annealing.

SUMMARY OF THE INVENTION

According to one aspect of the invention, an alloy of Mg, O and Zn having a wide electrical bandgap is fabricated. The fabrication begins by providing an $Al_2O_3$ substrate in a deposition chamber. The $Al_2O_3$ substrate is a single-crystal with a (0001) crystal structure orientation. A ceramic, MgO target is placed in the deposition chamber. A layer of MgO is deposited on the $Al_2O_3$ substrate by laser ablation of the MgO target. A ceramic, ZnO target is also placed in the deposition chamber. A layer of ZnO is deposited on the $Al_2O_3$ substrate using laser ablation of the ZnO target. The deposition of alternating layers of MgO and ZnO using laser ablation is repeated.

According to a further aspect of the invention, MgO is deposited in layers approximately 1 nm thick and ZnO is deposited in layers approximately 0.75 to 2.5 nm thick.

According to a further aspect of the invention, MgO is deposited in a molecular ratio to ZnO within the range of 0.58:1.0 to 1.95:1.0.

According to a further aspect of the invention, at least 50 layers of MgO and ZnO are deposited and the alloy is at least 100 nm thick.

According to a further aspect of the invention, the alternating layers of MgO and ZnO are deposited to provide a bandgap of at least 5.0 eV.

According to a further aspect of the invention, the alternating layers of MgO and ZnO are deposited to provide a bandgap of at least approximately 6.0 eV.

According to another aspect of the invention, a composition of Zn, Mg and O, having an electrical bandgap of at least 5.0 eV is fabricated. A substrate is provided, and then alternating layers of MgO and ZnO are deposited on the substrate.

According to further aspects of the invention, the substrate is a single-crystal of $Al_2O_3$ with a (0001) crystal structure orientation. The layers of MgO and ZnO are deposited by providing a ceramic target of each compound, then directing a laser at the ceramic targets and ablating the targets to deposit the compounds on the substrate. The layers of MgO have a uniform thickness and the layers of ZnO have uniform thickness.

According to further aspects of the invention, the molecular ratio of Mg to Zn in the composition is in the range of 0.58:1.0 to 1.95:1.0.

According to further aspects of the invention, the ratio between the uniform thickness of ZnO and the uniform thickness of MgO is within the range of 0.75:1.0 to 2.5:1.0 and the thickness.

According to a further aspect of the invention, the uniform thickness of MgO is approximately 1 nm.

DETAILED DESCRIPTION OF THE INVENTION

Stable, wide-bandgap MZO alloys are obtained by layering ZnO and MgO. This multilayer, MZO alloys consist of stratified ZnO and MgO layers and are grown on a (0001) $Al_2O_3$ substrate by sequential deposition of ZnO and MgO layers. This sequential deposition is repeated for a number of periods to obtain a desired thickness. In one preferred embodiment of the invention, the thickness of ZnO layers is 1.25 nm and the thickness of MgO layers is 1 nm. In this embodiment, to obtain a total thickness of approximately 300 nm requires approximately 133 layers of ZnO and MgO (or 133 periods) and to obtain a total thickness of 350 nm requires approximately 156 layers of ZnO and MgO (or 156 periods).

Figure 1:
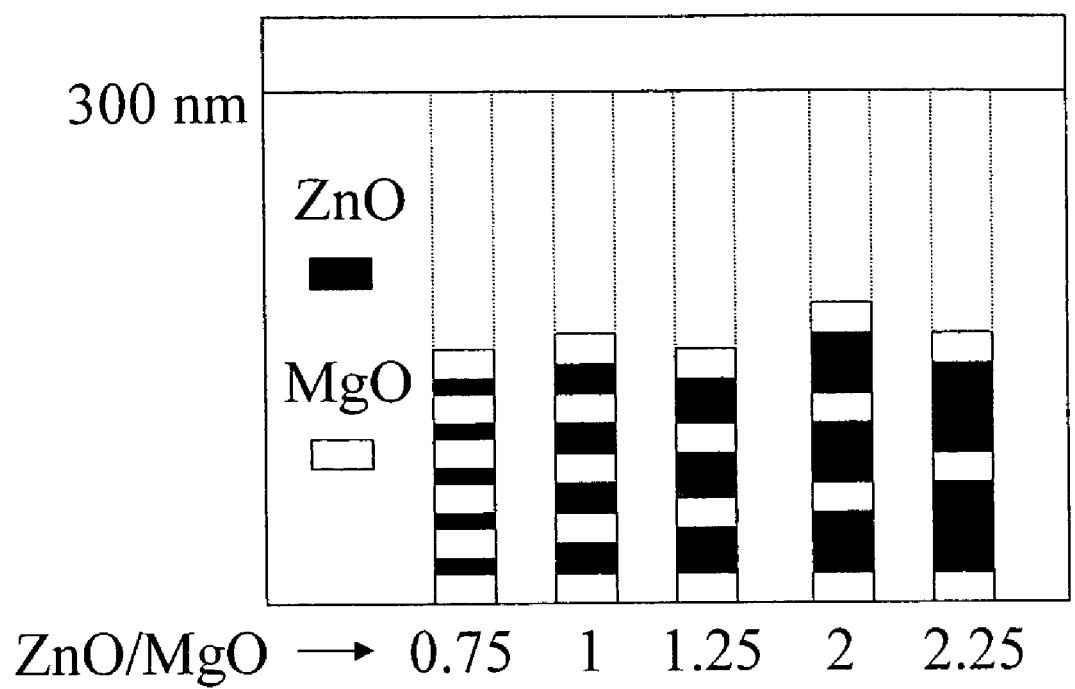
FIG. 1 is a schematic diagram of MZO thin films with various sublayer thicknesses as shown.

To obtain uniform properties of the MZO alloy throughout its structure, the layers of ZnO and MgO have uniform thickness. In other words, each layer of ZnO has a thickness ($t_1$), which is equal to other layers of ZnO and each layer of MgO has a thickness ($t_2$), which is equal to other layers of MgO. In other preferred embodiments of the invention, $t_1$ is in the range from 0.75 to 2.5 nm while $t_2$ is 1 nm. A schematic diagram showing cross sections of MZO structures with thicknesses within these ranges is shown in FIG. 1. Changing the thickness ratio of ZnO to MgO changes the bandgap of the MZO alloy. Accordingly, in still other preferred embodiments of the invention, the thicknesses of both ZnO and MgO are varied based upon the desired bandgap of the MZO alloy.

In one preferred embodiment of the invention, the layers of ZnO and MgO are deposited using PLD. Ceramic targets of MgO and ZnO are prepared by conventional powder processing routines using ultra-pure (99.99%) MgO and ZnO powders.

The $Al_2O_3$ substrate is preferably polished on both sides. Prior to deposition it is cleaned in diluted nitric acid followed by ultrasonic cleaning in acetone for 3 min, ultrasonic cleaning in methanol for 2 min, rinsed in water and finally dried using nitrogen-gas flow. The $Al_2O_3$ substrate is placed in the deposition chamber, which is evacuated to $1 \times 10^{-6}$ Torr. Oxygen is then introduced to obtain a pressure of 1 mTorr. Prior to deposition, the $Al_2O_3$ substrate is heated to 750° C.

ZnO and MgO targets are also placed in the deposition chamber. These targets were prepared by conventional powder-processing routines using ultra pure (99.99%) MgO and ZnO powders. The targets are maintained at approximately 5 cm from the $Al_2O_3$ substrate during deposition. The substrate is placed off center from the incoming deposition plume. This reduces the plasma damage and improves the crystalline quality.

A KrF (248 nm) excimer laser with a pulse energy density of 2–2.5 $J/cm^2$ at a pulse repetition rate of 5 Hz provides energy for the deposition.

Figure 2:
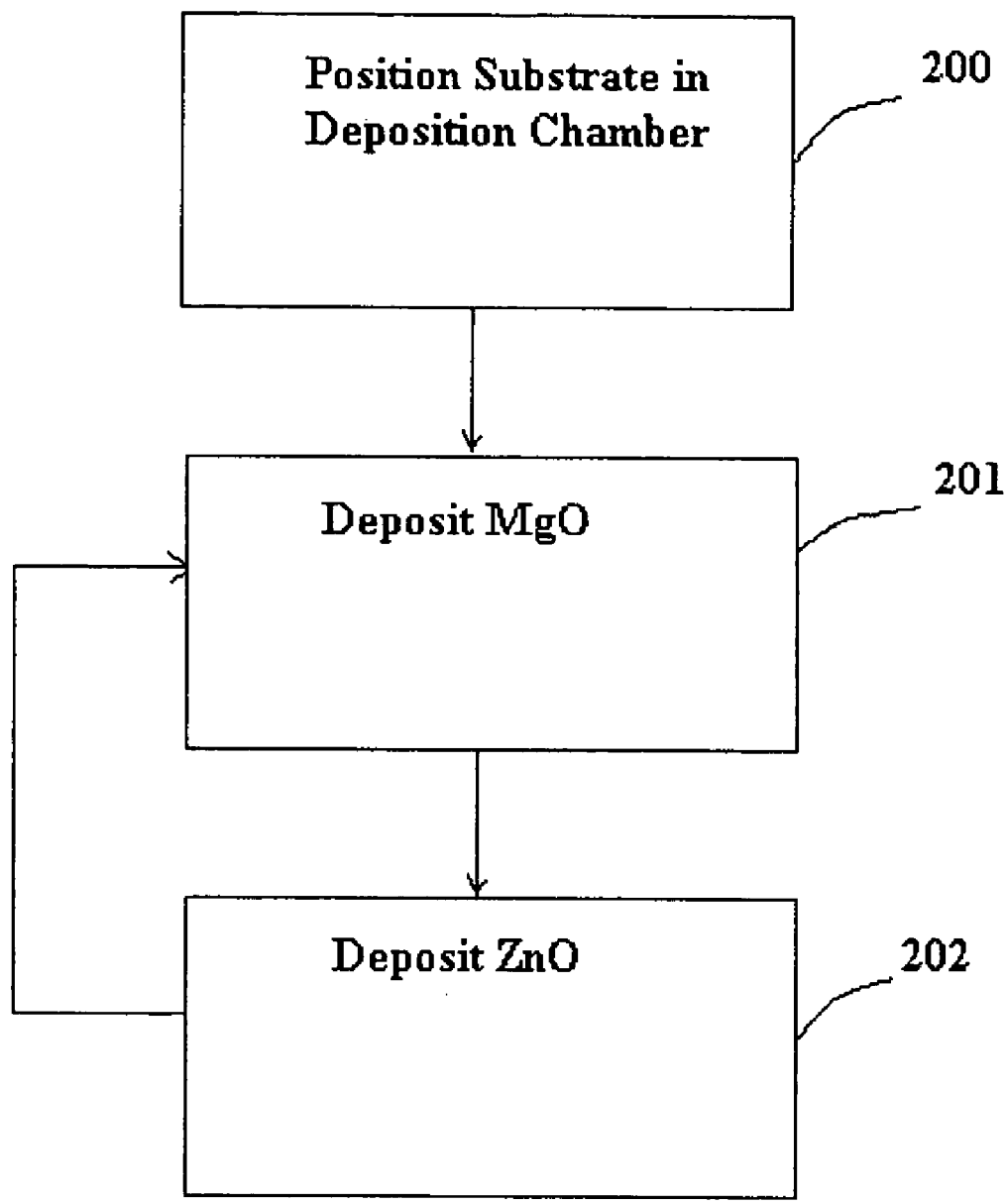
FIG. 2 is a block diagram showing one preferred method of fabricating MZO thin films.

With reference to FIG. 2, the above-described method of fabrication is shown. The substrate is placed in the deposition chamber at step 200. A layer of MgO is deposited on the substrate at step 201. A layer of ZnO is deposited on the substrate at step 202. The method continues by repeatedly depositing a layer of MgO at step 201 followed by a layer of ZnO at step 202, until the resulting film attains the desired thickness. The resulting thin films exhibit structural stability even through annealing at 750° C. for an hour in $O_2$.

Figure 3:
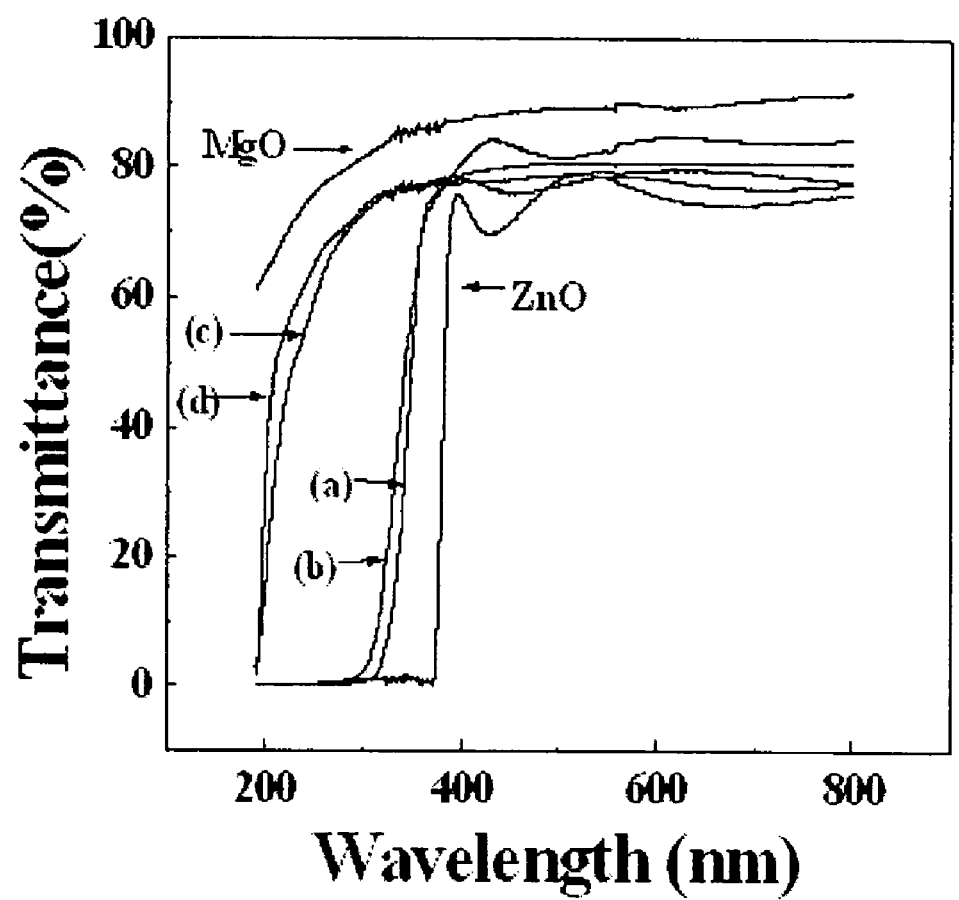
FIG. 3 is a graph showing the optical transmissions of MZO thin films with various sublayer thicknesses.

With reference to FIG. 3, the transmittance spectra of $Mg_xZn_{1-x}O$ thin films are shown for varying ratios of $t_1$ to $t_2$. The transmittance spectra of MgO and ZnO deposited under similar conditions are shown for comparison. The uppermost trace is MgO and the trace with the highest absorption transition is ZnO, as identified. Between these two traces the remaining transmittance spectra. Trace (a) identifies $t_1$ equal to 2.5 nm and $t_2$ equal to 1 nm. Trace (b) identifies $t_1$ equal to 2 nm and $t_2$ equal to 1 nm. Trace (c) identifies $t_1$ equal to 1.25 nm and $t_2$ equal to 1 nm. Trace (d) identifies $t_1$ equal to 0.75 nm and $t_2$ equal to 1 nm. All of the thin films have high transparency of greater than 80% with a sharp absorption edge. With a decrease in $t_1$ from 2.25 to 1.25 nm, the absorption edge is shifted from above 350 nm to around 200 nm.

Figure 4:
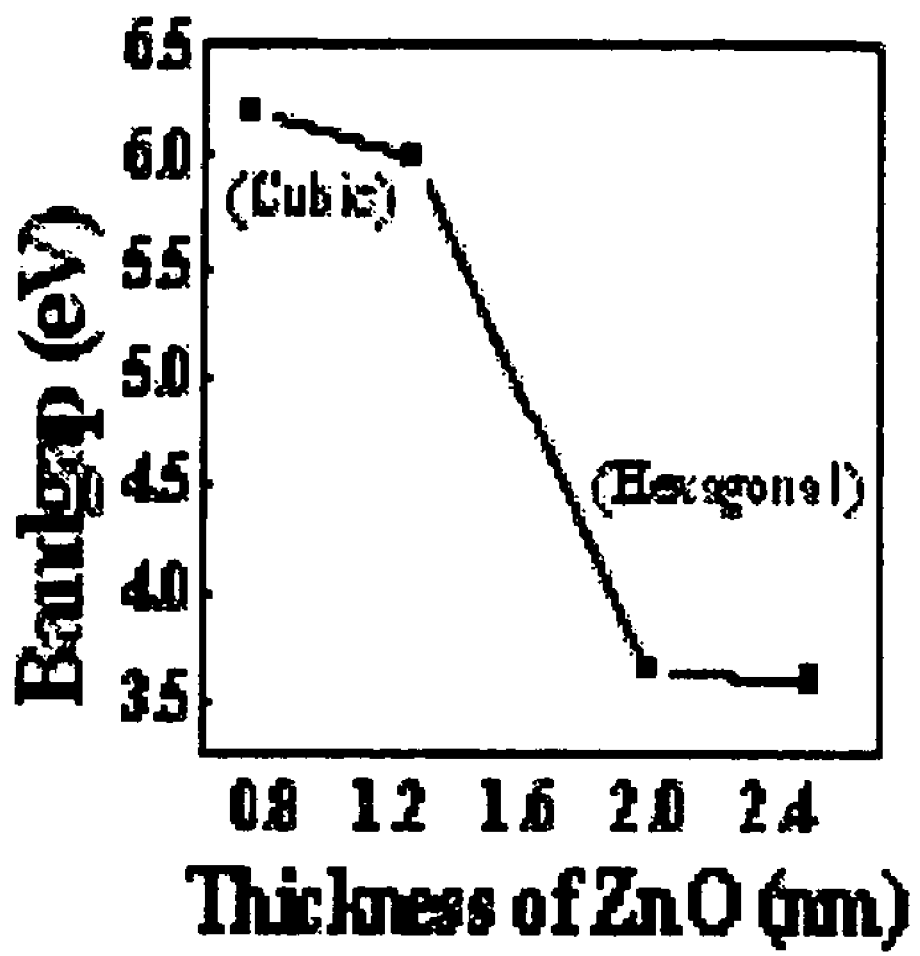
FIG. 4 is a graph showing the bandgaps of MZO thin films with various sublayer thicknesses.

With reference to FIG. 4, the bandgap energies, as calculated from the transmittance spectra, are shown for the same ratios of $t_1$ to $t_2$. Specifically, the bandgap energies ($E_g$) are determined using an $a^2$ versus $E_g$ plot and the spectra are fit to the data assuming $a^2$ is equal to ($hv-E_g$), where $a^2$ is the absorption and hv is the photon energy for both cubic and hexagonal structure. As shown, the bandgap energies increased from 3.7 eV to 6.2 eV with the decrease of $t_1$ from 2.25 to 1.25 nm. Again, these bandgap energies were obtained by PLD at a growth temperature of 750° C. Other temperatures must be used to obtain a bandgap between 4.0 to 6.0 eV.

Figure 5:
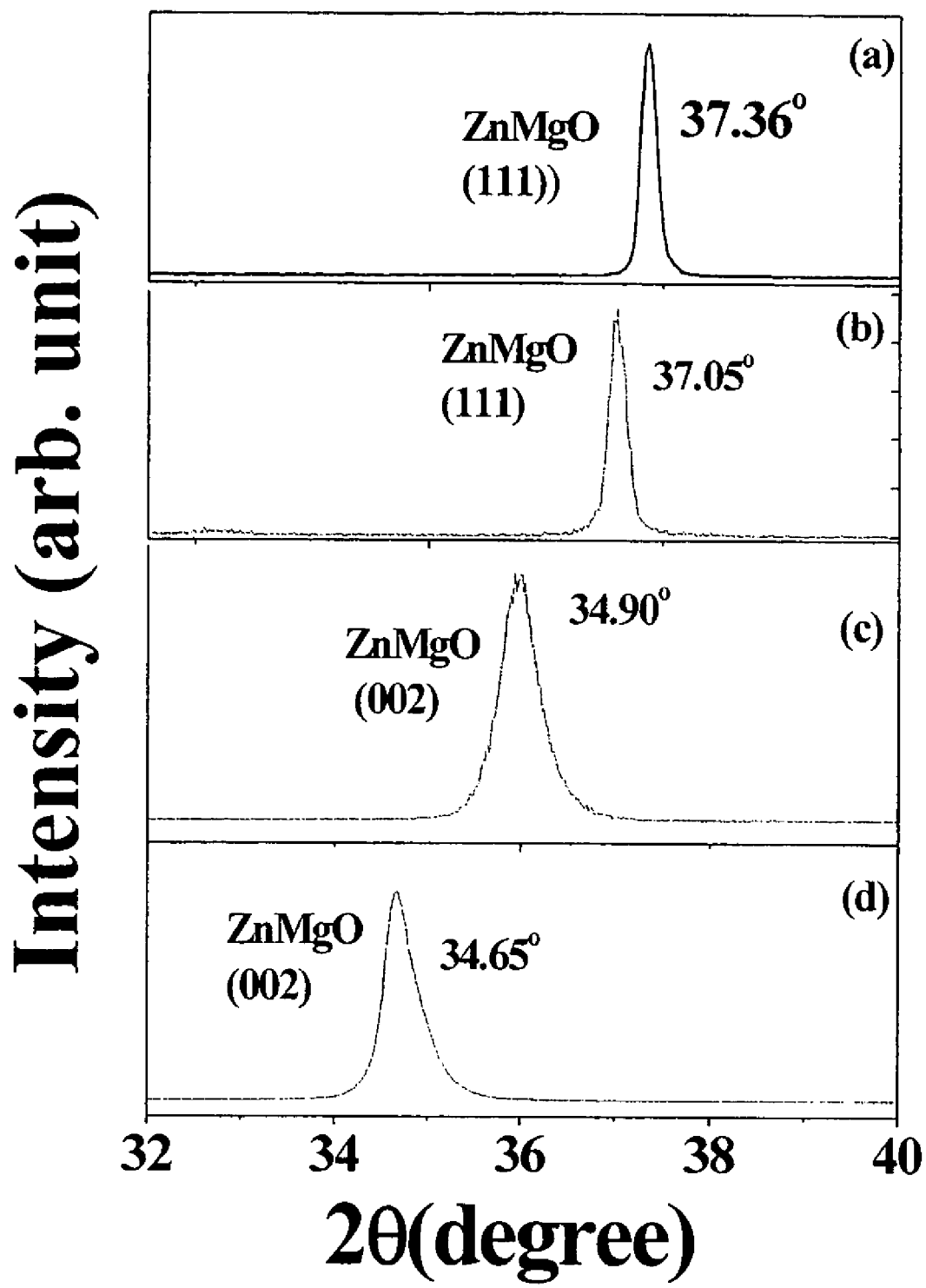
FIG. 5 is a graph showing the x-ray diffraction peaks of MZO thin films with various sublayer thicknesses.

With reference to FIG. 5, x-ray diffraction (XRD) scans of the same MZO thin films are shown with the same sublayer thicknesses shown in FIG. 3. All of these films have a single peak of MZO along with a peak for the substrate, which indicates a uniform crystal structure. From these, it is noted that with the decrease in $t_1$, the structure of the films changed from wurtzite hexagonal to cubic phase. The hexagonal phase had (0002) orientation and the cubic phase was oriented along (111), which is that of MgO.

Although the invention has been described with reference to specific preferred embodiments and methods, those skilled in the art will appreciate that many modifications and variations are possible without departing from the teachings of the invention. All such modifications and variations are intended to be encompassed within the scope of the following claims.

We claim:

1. A method of fabricating an alloy of Mg, O and Zn having a wide electrical bandgap comprising the steps of:
   a. providing an $Al_2O_3$ substrate in a deposition chamber;
   b. depositing a layer of MgO on the $Al_2O_3$ substrate using laser ablation;

c. depositing a layer of ZnO on the $Al_2O_3$ substrate using laser ablation after the step of depositing the layer of MgO on the $Al_2O_3$ substrate;

d. repeating, at least one time, the step of depositing the layer of MgO on the $Al_2O_3$ substrate using laser ablation after the step of depositing the layer of ZnO on the $Al_2O_3$ substrate using laser ablation; and e. repeating, at least one time, the step of depositing the layer of ZnO on the $Al_2O_3$ substrate using laser ablation after the step of depositing the layer of MgO on the $Al_2O_3$ substrate using laser ablation, whereby the alloy is formed of alternating layers of MgO and ZnO and wherein the alloy has an electrical bandgap of at least 3.5 eV.

2. The method of fabricating an alloy of claim 1, wherein the step of providing the $Al_2O_3$ substrate in a deposition chamber further comprises providing a single-crystal of $Al_2O_3$ with a (0001) crystal structure orientation.

3. The method of fabricating an alloy of claim 1, wherein:

a. the step of depositing the layer of MgO on the $Al_2O_3$ substrate using laser ablation comprises depositing a thickness of approximately 1 nm; and b. the step of repeating, at least one time, the step of depositing the layer of MgO on the $Al_2O_3$ substrate using laser ablation after the step of depositing the layer of ZnO on the $Al_2O_3$ substrate using laser ablation comprises depositing a thickness of approximately 1 nm.

4. The method of fabricating an alloy of claim 3, wherein:

a. the step of depositing the layer of ZnO on the $Al_2O_3$ substrate using laser ablation after the step of depositing the layer of MgO on the $Al_2O_3$ substrate, comprises depositing a thickness of approximately 0.75 to 2.5 nm; and b. the step of repeating, at least one time, the step of depositing the layer of ZnO on the $Al_2O_3$ substrate using laser ablation after the step of depositing the layer of MgO on the $Al_2O_3$ substrate using laser ablation comprises depositing a thickness of approximately 0.75 to 2.5 nm.

5. The method of fabricating an alloy of claim 1, wherein in the steps of:

a. repeating, at least one time, the step of depositing the layer of MgO on the $Al_2O_3$ substrate using laser ablation after the step of depositing the layer of ZnO on the $Al_2O_3$ substrate using laser ablation; and b. repeating, at least one time, the step of depositing the layer of ZnO on the $Al_2O_3$ substrate using laser ablation after the step of depositing the layer of MgO on the $Al_2O_3$ substrate using laser ablation, MgO is deposited in a molecular ratio to ZnO within the range of 0.58:1.0 to 1.95:1.0.

6. The method of fabricating an alloy of claim 1, wherein the steps of:

a. repeating, at least one time, the step of depositing the layer of MgO on the $Al_2O_3$ substrate using laser ablation after the step of depositing the layer of ZnO on the $Al_2O_3$ substrate using laser ablation; and b. repeating, at least one time, the step of depositing the layer of ZnO on the $Al_2O_3$ substrate using laser ablation after the step of depositing the layer of MgO on the $Al_2O_3$ substrate using laser ablation, are repeated until the alloy is at least 100 nm thick.

7. The method of fabricating an alloy of claim 1, wherein the steps of:

a. repeating, at least one time, the step of depositing the layer of MgO on the $Al_2O_3$ substrate using laser ablation after the step of depositing the layer of ZnO on the $Al_2O_3$ substrate using laser ablation; and b. repeating, at least one time, the step of depositing the layer of ZnO on the $Al_2O_3$ substrate using laser ablation after the step of depositing the layer of MgO on the $Al_2O_3$ substrate using laser ablation, are each repeated at least 50 times.

8. The method of fabricating an alloy of claim 1, wherein the alternating layers of MgO and ZnO are deposited to provide a bandgap of at least 5.0 eV.

9. The method of fabricating an alloy of claim 1, wherein the alternating layers of MgO and ZnO are deposited to provide a bandgap of approximately 6.0 eV.

10. The method of fabricating an alloy of claim 1, wherein the alternating layers of MgO and ZnO are deposited to provide a bandgap of at least 6.0 eV.

11. The method of fabricating an alloy of claim 1, further comprising the steps of:

a. placing a ceramic target of MgO in the deposition chamber for the laser ablation of MgO; and b. placing a ceramic target of ZnO in the deposition chamber for the laser ablation of ZnO.

12. A method of fabricating a composition of Zn, Mg and O, having an electrical bandgap of at least 5.0 eV, comprising the steps of:

a. providing a substrate; and b. depositing alternating layers of MgO and ZnO on the substrate.

13. The method of claim 12, wherein the step of providing the substrate comprises providing a single-crystal of $Al_2O_3$ with a (0001) crystal structure orientation in a deposition chamber.

14. The method of claim 13, wherein the step of depositing alternating layers of MgO and ZnO on the substrate comprises:

a. providing an MgO target and a ZnO target;

b. directing a laser at the MgO and ZnO targets; and c. ablating the targets to deposit MgO and ZnO on the substrate.

15. The method of claim 14, wherein in the step of depositing alternating layers of MgO and ZnO on the substrate, the molecular ratio of Mg to Zn is in the range of 0.58:1.0 to 1.95:1.0.

16. The method of claim 14, wherein in the step of depositing alternating layers of MgO and ZnO on the substrate, layers of MgO are deposited with a uniform MgO thickness and layers of ZnO are deposited with a uniform ZnO thickness.

17. The method of claim 16, wherein a ratio between the uniform thickness of ZnO and the uniform thickness of MgO is within the range of 0.75:1.0 to 2.5:1.0.

18. The method of claim 17, wherein the uniform thickness of MgO is approximately 1 nm.

* * * * *